(12) United States Patent
Szeremi

(10) Patent No.: US 8,161,364 B1
(45) Date of Patent: *Apr. 17, 2012

(54) OUT OF ORDER CHECKSUM CALCULATION FOR FRAGMENTED PACKETS

(75) Inventor: Vendel Szeremi, Eggenstein-Leopoldshafen (DE)

(73) Assignee: Marvell International Ltd., Hamilton (BM)

( * ) Notice: Subject to any disclaimer, the term of this patent is extended or adjusted under 35 U.S.C. 154(b) by 922 days.

This patent is subject to a terminal disclaimer.

(21) Appl. No.: 12/221,168

(22) Filed: Jul. 31, 2008

Related U.S. Application Data

(63) Continuation of application No. 10/387,299, filed on Mar. 12, 2003, now Pat. No. 7,415,652.

(60) Provisional application No. 60/404,804, filed on Aug. 19, 2002.

(51) Int. Cl.
*H03M 13/00* (2006.01)
*G06F 11/10* (2006.01)

(52) U.S. Cl. ........................ 714/807; 714/758

(58) Field of Classification Search .................. 714/807, 714/758
See application file for complete search history.

(56) References Cited

U.S. PATENT DOCUMENTS

| | | | |
|---|---|---|---|
| 5,675,591 A * | 10/1997 | Salzwedel et al. | ............ 714/807 |
| 5,815,516 A | 9/1998 | Aaker et al. | |
| 5,898,713 A | 4/1999 | Melzer et al. | |
| 5,937,169 A | 8/1999 | Connery et al. | |
| 5,984,869 A | 11/1999 | Chiao et al. | |
| 6,314,525 B1 | 11/2001 | Mahalingham et al. | |
| 6,434,620 B1 | 8/2002 | Boucher et al. | |
| 6,453,345 B2 | 9/2002 | Trcka et al. | |
| 6,453,357 B1 | 9/2002 | Crow et al. | |
| 6,453,360 B1 | 9/2002 | Muller et al. | |
| 6,574,224 B1 * | 6/2003 | Brueckheimer et al. | ... 370/395.6 |
| 6,964,008 B1 | 11/2005 | Van Meter, III | |
| 6,988,236 B2 | 1/2006 | Ptasinski et al. | |
| 7,024,593 B1 * | 4/2006 | Budd et al. | ...................... 714/48 |
| 7,124,205 B2 | 10/2006 | Craft et al. | |
| 7,174,393 B2 | 2/2007 | Boucher et al. | |
| 7,251,704 B2 | 7/2007 | Solomon et al. | |
| 7,415,652 B1 | 8/2008 | Szeremi | |
| 2002/0184598 A1 * | 12/2002 | Bace | ............................. 714/807 |

OTHER PUBLICATIONS

Postel, User Datagram Protocol, Aug. 28, 1980, University of Southern California Information Sciences Institute, USA.
Postel, Internet Protocol; DARPA Internet Program Protocol Specification, Sep. 1981, University of Southern California Information Sciences Institute, USA.
Braden et al., Computing the Internet Checksum, Sep. 1988, University of Southern California Information Sciences Institute, USA.
USPTO Non-Final Office Action mailed Apr. 6, 2007 for U.S. Appl. No. 10/387,299, filed Mar. 12, 2003.
Amendment filed Jul. 6, 2007 in response to USPTO Non-Final Office Action mailed Apr. 6, 2007 for U.S. Appl. No. 10/387,299, filed Mar. 12, 2003.

(Continued)

*Primary Examiner* — M. Mujtaba K Chaudry

(57) ABSTRACT

A network interface controller comprises a first interface that sequentially receives second and first fragments of a packet comprising second and first data portions of the packet, respectively. A checksum adder calculates a first checksum for the first fragment based on a second checksum for the second fragment and the first data portion of the first fragment. The network interface controller writes the first checksum to a checksum field in a header of the packet.

40 Claims, 6 Drawing Sheets

OTHER PUBLICATIONS

USPTO Non-Final Office Action mailed Sep. 24, 2007 for U.S. Appl. No. 10/387,299, filed Mar. 12, 2003.

Amendment filed Jan. 24, 2008 in response to USPTO Non-Final Office Action mailed Sep. 24, 2007 for U.S. Appl. No. 10/387,299, filed Mar. 12, 2003.

USPTO Notice of Allowance mailed Apr. 17, 2008 for U.S. Appl. No. 10/387,299, filed Mar. 12, 2003.

Issue Fee filed Jul. 16, 2008 in response to USPTO Notice of Allowance mailed Apr. 17, 2008 for U.S. Appl. No. 10/387,299, filed Mar. 12, 2003.

* cited by examiner

OUT OF ORDER CHECKSUM CALCULATION FOR FRAGMENTED PACKETS

CROSS-REFERENCE TO RELATED APPLICATIONS

This application is a continuation of U.S. patent application Ser. No. 10/387,299, filed Mar. 12, 2003, which claims the benefit of U.S. Provisional Patent Application No. 60/404,804, filed Aug. 19, 2002, the disclosures thereof incorporated by reference herein in their entirety.

BACKGROUND

The present invention relates generally to data communications. More particularly, the present invention relates to checksum calculation for data packets to be transmitted over a communication network.

Packet switching is a widely-used technique for transmitting data over a communications network, which can be electronic, optical, wireless and the like. A file of data to be transmitted across the network is first broken into portions referred to as packets. A header is added to each packet. The header includes parameters describing the packet, such as its size, and delivery information, such as the source and destination addresses of the packet. The packets are sent over the network, and after arriving at the destination, are reassembled to recreate the data file.

However, during transmission over the network, the contents of a packet may become corrupted. One method for detecting such errors is checksumming. According to this method, some or all of the bits in the packet are combined, for example by one's-complement addition, prior to transmission to produce a checksum, which is then written to a field in a header or trailer of the packet. At the destination, the same checksum method is applied to the received packet to independently calculate a checksum. If the checksum in the packet header and the checksum calculated at the destination are not the same, the packet was corrupted during transmission.

In general, data is transmitted between network devices that can be implemented as personal computers, cellular telephones, personal digital assistants, and the like, and that each comprise a processor, such as a central processing unit, and a network interface controller, such as a network interface card. In many conventional implementations, the checksum is calculated by processor. However, according to a method referred to as "checksum offload," the checksum can be calculated by some device other than the processor, such as the network interface controller.

When a transport-layer packet is large, the network-layer module of the protocol stack breaks the transport-layer packet into two or more fragments before sending the transport-layer packet to the network. For example, in a User Datagram Protocol/Internet Protocol (UDP/IP) protocol stack, when the size of a UDP packet exceeds the Maximum Transmission Unit (MTU) size of the network, the IP module of the protocol stack fragments the UDP packet, thereby generating multiple IP packets, which are referred to as fragments of the UDP packet. One of the fragments contains a portion of the payload of the UDP packet and the header of the UDP packet. The header contains a field for the checksum.

Conventional network interface controllers are unable to perform checksum offload for such fragmented packets. Therefore, checksums for fragmented packets are conventionally performed by the processor in the protocol stack or device driver, with the consequent loss of the advantages of checksum offload.

SUMMARY

In general, in one aspect, the invention features a network device comprising a processor adapted to receive a first fragment of a packet, the first fragment comprising a first portion of a payload of the packet and a header of the packet, the header comprising a checksum field; wherein the processor receives a second fragment of the packet, the second fragment comprising a second portion of the payload of the packet; a network interface controller; wherein the processor transmits the second fragment of the packet to the network interface controller, and subsequently transmits the first fragment of the packet to the network interface controller; wherein the network interface controller comprises a checksum adder adapted to calculate a checksum of the second fragment of the packet, and calculate a checksum of the first fragment of the packet after calculating a checksum of the second fragment of the packet, wherein the checksum of the first fragment of the packet comprises the checksum of the second fragment of the packet, and write the checksum of the first fragment of the packet to the checksum field in the header of the packet.

Particular implementations can include one or more of the following features. The network interface controller further comprises a network interface adapted to transmit the second fragment, and transmit the first fragment after transmitting the second fragment. The network interface is further adapted to transmit a second packet comprising the second fragment. The network interface is further adapted to transmit a third packet comprising the first fragment. The packet is a transport-layer packet; and the second and third packets are network-layer packets. The transport-layer packet is a user datagram protocol (UDP) packet. The transport-layer packet is a transport control protocol (TCP) packet. The network-layer packets are Internet protocol (IP) packets. To calculate the checksum of the first fragment of the packet, the checksum adder calculates a checksum of the first portion of the payload of the packet. To calculate the checksum of the first portion of the payload of the packet, the checksum adder forms a 16-bit one's complement of the one's complement sum of the first portion of the payload of the packet. To calculate the checksum of the second fragment of the transport-layer packet, the checksum adder calculates a checksum of the second portion of the payload of the packet. To calculate the checksum of the second portion of the payload of the packet, the checksum adder forms a 16-bit one's complement of the one's complement sum of the second portion of the payload of the packet.

In general, in one aspect, the invention features a network interface controller comprising a processor interface adapted to receive a first fragment of a packet, the first fragment comprising a first portion of a payload of the packet and a header of the packet, the header comprising a checksum field; wherein the processor interface receives a second fragment of the packet, the second fragment comprising a second portion of the payload of the packet; a checksum adder adapted to calculate a checksum of the second fragment of the packet, and calculate a checksum of the first fragment of the packet after calculating the checksum of the second fragment of the packet, wherein the checksum of the first fragment of the packet comprises the checksum of the second fragment of the packet, and write the checksum of the first fragment of the packet to the checksum field in the header of the packet.

Particular implementations can include one or more of the following features. The network interface controller further comprises a network interface adapted to transmit the second fragment, and transmit the first fragment after transmitting the second fragment. The network interface is further adapted to transmit a second packet comprising the second fragment. The network interface is further adapted to transmit a third packet comprising the first fragment. The packet is a transport-layer packet and the second and third packets are network-layer packets. The transport-layer packet is a user datagram protocol (UDP) packet. The transport-layer packet is a transport control protocol (TCP) packet. The network-layer packets are is Internet protocol (IP) packets. To calculate the checksum of the first fragment of the transport-layer packet, the checksum adder calculates a checksum of the first portion of the payload of the packet. To calculate the checksum of the first portion of the payload of the packet, the checksum adder forms a 16-bit one's complement of the one's complement sum of the first portion of the payload of the packet. To calculate the checksum of the second fragment of the transport-layer packet, the checksum adder calculates a checksum of the second portion of the payload of the packet. To calculate the checksum of the second portion of the payload of the packet, the checksum adder forms a 16-bit one's complement of the one's complement sum of the second portion of the payload of the.

In general, in one aspect, the invention features a network device comprising a processor comprising an input unit adapted to receive a first fragment of a packet, the first fragment comprising a first portion of a payload of the packet and a header of the packet, the header comprising a checksum field; wherein the input unit receives a second fragment of the packet, the second fragment comprising a second portion of the payload of the packet; a calculator adapted to calculate a checksum of the second fragment of the packet, calculate a checksum of the first fragment of the packet after calculating a checksum of the second fragment of the packet, wherein the checksum of the first fragment of the packet comprises the checksum of the second fragment of the packet, and write the checksum of the packet to the checksum field in the header of the packet.

Particular implementations can include one or more of the following features. The network device further comprises an output unit adapted to transmit the second fragment, and transmit the first fragment after transmitting the second fragment. The output unit is further adapted to transmit a second packet comprising the second fragment. The output unit is further adapted to transmit a third packet comprising the first fragment. The packet is a transport-layer packet and wherein the second and third packets are network-layer packets. The transport-layer packet is a user datagram protocol (UDP) packet. The transport-layer packet is a transport control protocol (TCP) packet. The network-layer packets are Internet protocol (IP) packets. To calculate the checksum of the first fragment of the transport-layer packet, the calculator calculates a checksum of the first portion of the payload of the packet. To calculate the checksum of the first portion of the payload of the packet, the calculator forms a 16-bit one's complement of the one's complement sum of the first portion of the payload of the packet. To calculate the checksum of the second fragment of the transport-layer packet, the calculator calculates a checksum of the second portion of the payload of the packet. To calculate the checksum of the second portion of the payload of the packet, the calculator forms a 16-bit one's complement of the one's complement sum of the second portion of the payload of the packet.

In general, in one aspect, the invention features a method and computer-readable media comprising receiving a first fragment of a packet, the first fragment comprising a first portion of a payload of the packet and a header of the packet, the header comprising a checksum field; receiving a second fragment of the packet, the second fragment comprising a second portion of the payload of the packet; calculating a checksum of the second fragment of the packet, calculating a checksum of the first fragment of the packet after calculating the checksum of the second fragment of the packet, wherein the checksum of the first fragment of the packet comprises the checksum of the second fragment of the packet, and writing the checksum of the packet to the checksum field in the header of the packet.

Particular implementations can include one or more of the following features. The method comprises transmitting the second fragment; and transmitting the first fragment after writing the checksum of the first fragment to the checksum field in the header of the first fragment. Transmitting the second fragment comprises transmitting a second packet comprising the second fragment. Transmitting the first fragment comprises transmitting a third packet comprising the first fragment. The packet is a transport-layer packet and the second and third packets are network-layer packets. The transport-layer packet is a user datagram protocol (UDP). packet The transport-layer packet is a transport control protocol (TCP) packet. The network-layer packets are Internet protocol (IP) packets. Calculating a checksum of the first fragment of the packet comprises calculating a checksum of the first portion of the payload of the packet. Calculating a checksum of the first portion of the payload of the packet comprises forming a 16-bit one's complement of the one's complement sum of the first portion of the payload of the packet. Calculating a checksum of the second fragment of the packet comprises calculating a checksum of the second portion of the payload of the packet. Calculating a checksum of the second portion of the payload of the packet comprises forming a 16-bit one's complement of the one's complement sum of the second portion of the payload of the packet.

In general, in one aspect, the invention features a method and computer-readable media comprising receiving a packet comprising a header and a payload, the header comprising a checksum field; fragmenting the packet, comprising generating a first fragment of the packet, the first fragment comprising the header and a first portion of the payload, and generating a second fragment of the packet, the second fragment comprising a second portion of the payload; calculating a checksum of the packet, comprising calculating a checksum of the second fragment of the packet, and calculating a checksum of the first fragment of the packet after calculating a checksum of the second fragment of the packet, wherein the checksum of the first fragment of the packet comprises the checksum of the second fragment of the packet; and writing the checksum of the packet to the checksum field in the header of the packet.

Particular implementations can include one or more of the following features. The method comprises transmitting the second fragment; and transmitting the first fragment after writing the checksum of the first fragment to the checksum field in the header of the first fragment. Transmitting the second fragment comprises transmitting a second packet comprising the second fragment. Transmitting the first fragment comprises transmitting a third packet comprising the first fragment. The packet is a transport-layer packet and the second and third packets are network-layer packets. The transport-layer packet is a user datagram protocol (UDP) packet. The transport-layer packet is a transport control protocol (TCP) packet. The network-layer packets are Internet protocol (IP) packets. Calculating a checksum of the first fragment of the packet comprises calculating a checksum of the first portion of the payload of the packet. Calculating a checksum of the first portion of the payload of the packet comprises forming a 16-bit one's complement of the one's complement sum of the first portion of the payload of the packet. Calculating a checksum of the second fragment of the transport-layer packet comprises calculating a checksum of the second portion of the payload of the packet. Calculating a checksum of the second portion of the payload of the packet comprises forming a 16-bit one's complement of the one's complement sum of the second portion of the payload of the packet.

The details of one or more implementations are set forth in the accompanying drawings and the description below. Other features will be apparent from the description and drawings, and from the claims.

Figure 1:
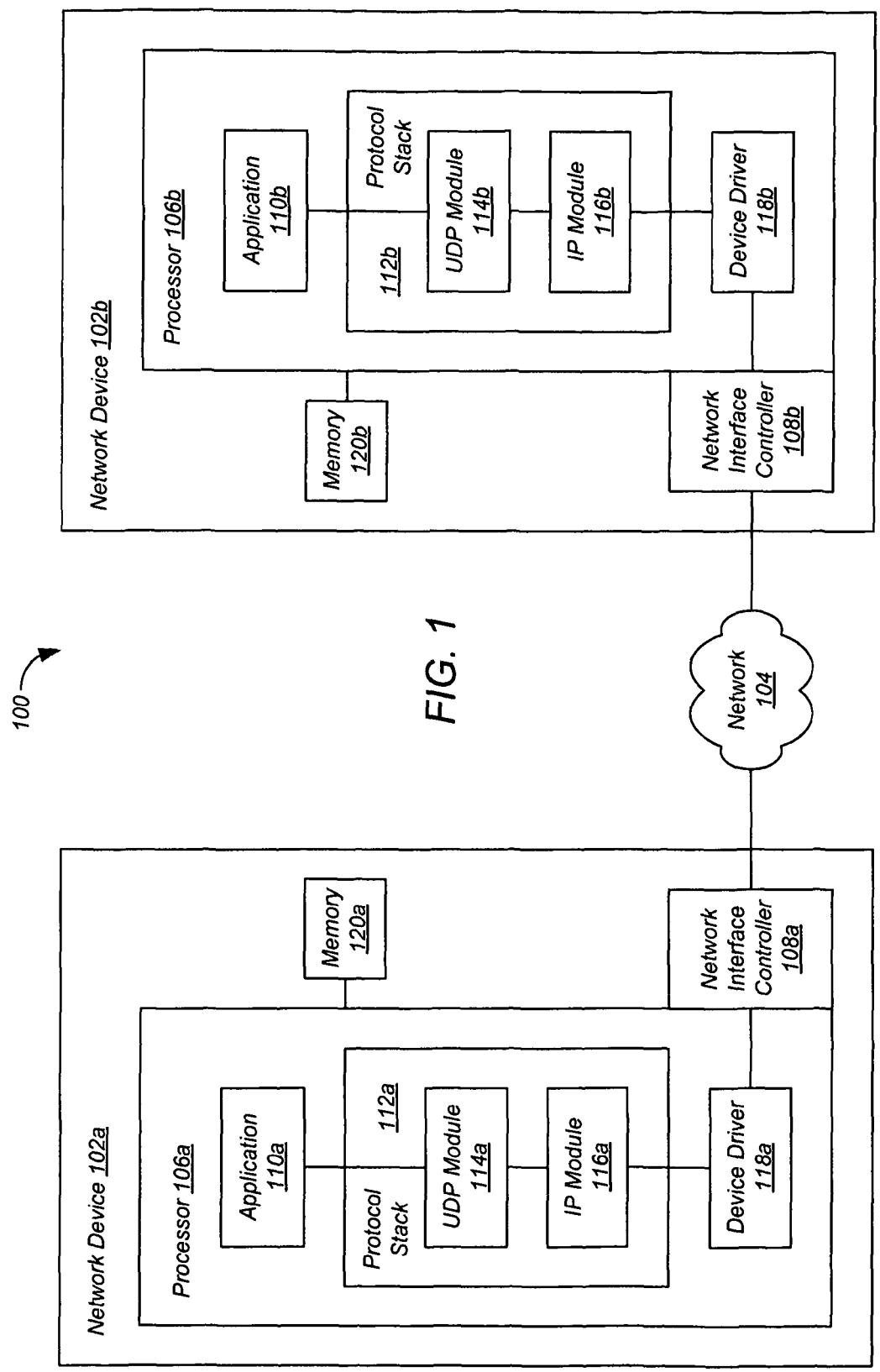
FIG. 1 depicts a data communications system according to a preferred embodiment that includes two network devices that communicate with each other over a network such as the Internet.

The leading digit(s) of each reference numeral used in this specification indicates the number of the drawing in which the reference numeral first appears.

DETAILED DESCRIPTION

FIG. 1 depicts a data communications system 100 according to a preferred embodiment that includes two network devices 102a and 102b that communicate with each other over a network 104 such as the Internet. Network devices 102 can be implemented as personal computers, cellular telephones, personal digital assistants, and the like, and can communicate over a network or directly with other devices. For example, a network device can be implemented as a single integrated circuit, and can communicate directly with another integrated circuit. Network devices 102 respectively comprise processors 106a and 106b, such as central processing units, network interface controllers 108a and 108b, such as network interface cards, and memories 120a and 120b, such as random-access memories.

Processors 106 execute software modules including an application 110, a protocol stack 112, and a device driver 118. Protocol stack 112 includes a User Datagram Protocol (UDP) module 114 that executes a UDP protocol and an Internet Protocol (IP) module 116 that executes an IP protocol. In other embodiments, protocol stack 112 comprises other modules that implement other transport-layer protocols, such as transport control protocol (TCP), and other network-layer protocols. Device driver 118 communicates with protocol stack 112 and network interface controller 108.

It is desirable to reduce the utilization of processors 106, thereby freeing processors 106 to perform other tasks. According to checksum offload, the checksum of each packet is calculated by some device other than processors 106, such as network interface controllers 108. This reduction in processor utilization also preserves the contents of the processor cache, resulting in fewer cache misses and therefore more efficient processor operation.

Figure 2:
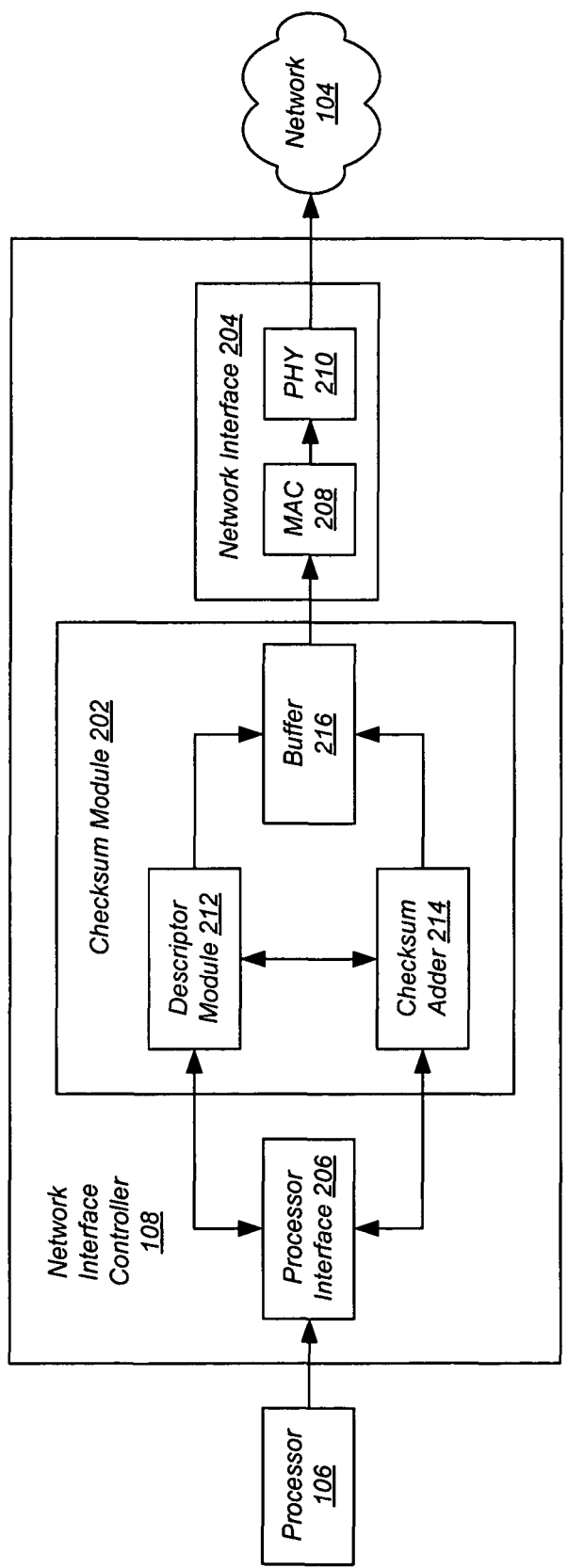
FIG. 2 depicts a network interface controller according to a preferred embodiment.

FIG. 2 depicts a network interface controller 108 according to a preferred embodiment. Network interface controller 108 comprises a checksum module 202, a network interface 204, and a processor interface 206. Network interface 204 comprises a media access controller 208 and a physical-layer device 210 that communicate with networks such as network 104 of FIG. 1 according to methods well-known in the relevant arts. Processor interface 206 communicates with a processor such as processors 106 of FIG. 1, generally over a processor bus such as a PCI bus, according to methods well-known in the relevant arts.

Checksum module 202 comprises a checksum adder 214 and a descriptor module 212 that communicate with each other and with processor interface 206. Checksum module 202 further comprises a buffer 216 that communicates with checksum adder 214, descriptor module 212, and network interface 204. Checksum adder 214 and descriptor module 212 can be implemented using standard switching logic devices, as will be apparent to one skilled in the relevant arts after reading this description.

Figure 3:
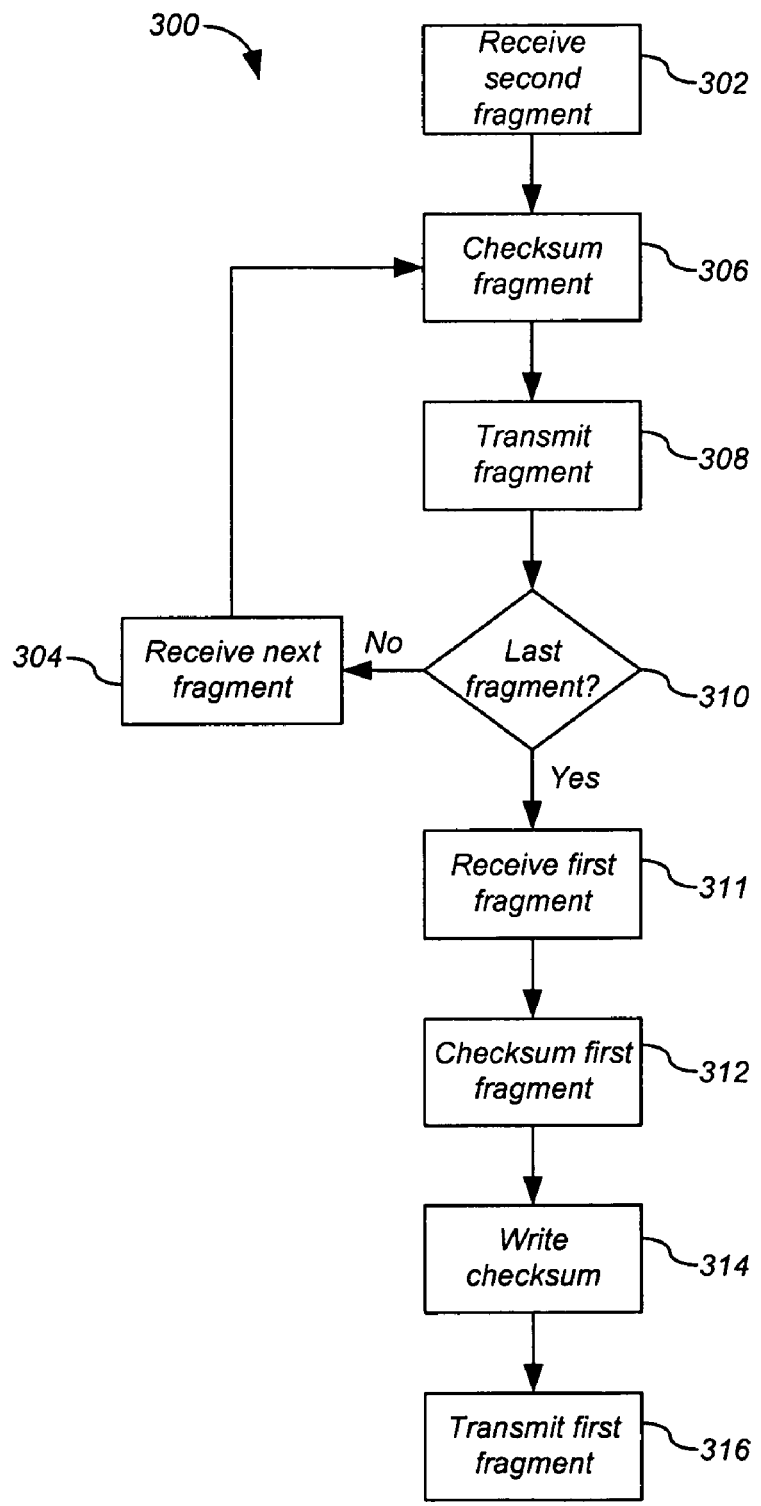
FIG. 3 depicts a checksum process performed by the network interface controller of FIG. 2 according to a preferred embodiment that implements UDP/IP.

FIG. 3 depicts a checksum process 300 performed by network interface controller 108 of FIG. 2 according to a preferred embodiment that implements UDP/IP. Other embodiments implement other transport-layer protocols, such as transport control protocol (TCP), and other network-layer protocols. Processor interface 206 of network interface controller 108 receives the second fragment of a user datagram protocol (UDP) packet from processor 106 (step 302). Preferably, device driver 118 stores the first fragment until the last fragment has been sent to network interface controller 108. Therefore, network interface controller 108 receives the second fragment first, and receives the first fragment last. Although this re-ordering of the fragments can be performed in network interface controller 108, the re-ordering is preferably performed by device driver 118 because it requires no additional buffer hardware in network interface controller 108, and instead requires only a few lines of code and only a small amount of the capacity of processor 106.

Figure 4:
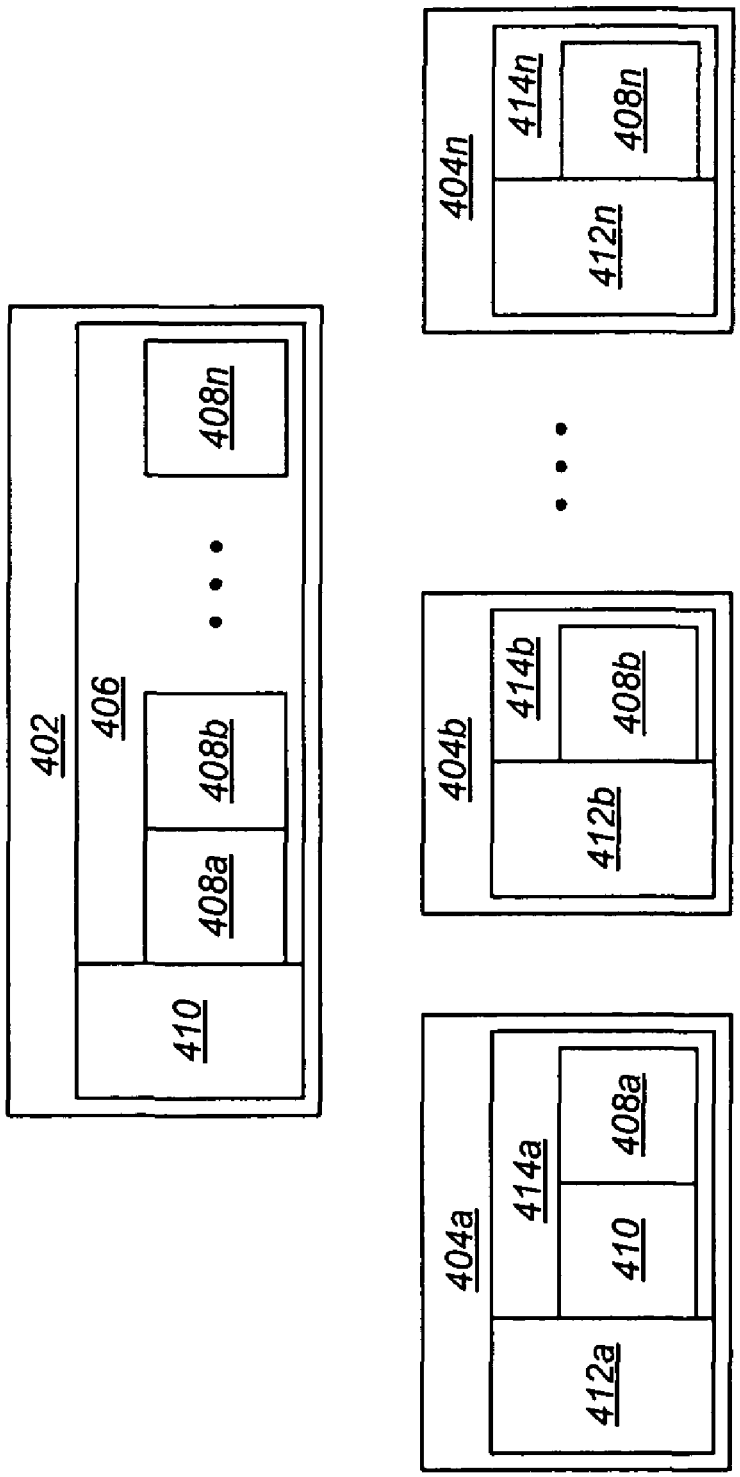
FIG. 4 depicts the relationship between a UDP packet and the IP packets that result from fragmenting the UDP packet.

Each fragment of the UDP packet is an IP packet. FIG. 4 depicts the relationship between a UDP packet 402 and the IP packets 404 that result from fragmenting UDP packet 402. Packet 402 comprises a header 410 and a payload 406. The payload 406 of UDP packet 402 comprises a plurality of payload portions 408a and 408b through 408n. The size of portions 408 are selected according to the MTU of network 104 such that the size of the UDP header 410 and the first UDP payload portion 408a combined, and the size of each subsequent UDP payload portion 408b through 408n, is less than the MTU.

The first fragment 404a of the UDP packet comprises an IP header 412a and an IP payload 414a that comprises UDP header 410 and the first portion 408a of UDP payload 406. UDP header 410 comprises a checksum field for storing the UDP checksum. Subsequently-received fragments comprise IP headers 412b through 412n, respectively, and portions 408b through 408n of payload 406 of UDP packet 402, respectively.

In a preferred embodiment, network interface controller 108 receives each fragment of the UDP packet in the following manner. Processor 106 generates a message, referred to herein as a "descriptor," for each fragment. The descriptor comprises information describing the fragment, including the location in memory 110 of the fragment, a flag that indicates whether the fragment is the first fragment of the UDP packet, a flag that indicates whether the fragment is the last fragment of the UDP packet, and an indicator of the portion of the fragment that should be checksummed (for example, the IP header is not checksummed). Network interface controller 108 then uses the information in the descriptor to retrieve the fragment. Of course, network interface controller 108 can receive each fragment of the UDP packet in other ways, as will be apparent to one skilled in the relevant arts after reading this description. Network interface controller 108 stores the first fragment of the UDP packet in buffer 216.

Checksum adder 214 calculates the checksum of the second fragment (step 306). In a preferred embodiment, the descriptor for the packet is received by descriptor module 212. Descriptor module 212 then passes the relevant information from the descriptor to checksum adder 214, which calculates the checksum in accordance with that information. In one embodiment, the checksum is calculated for each fragment (other than the first fragment) as it is received. Network interface 204 then transmits the second fragment to network 104 (step 308). In a preferred embodiment, the checksum for each fragment is calculated by forming a 16-bit one's complement of the one's complement sum of the payload of the IP packet, as described in "Computing the Internet Checksum," RFC 1071.

If the UDP packet has more fragments (step 310), the next fragment is received (step 304), checksummed (step 306), and transmitted to network 104 (step 308). The calculation of the checksum of each fragment continues from the checksum obtained from the previous fragment, if any, so that the checksum calculated for any fragment of a UDP packet includes the checksums calculated for the previous fragments of the UDP packet.

After receiving all of the other fragments of the UDP packet, network interface controller 108 receives the first fragment (step 311). After the checksum has been calculated for the last fragment of the UDP packet, checksum adder 214 calculates the checksum of the first fragment of the UDP packet (step 312). The calculation of the checksum of the first fragment continues from the checksum obtained from the last fragment, so that the checksum calculated for the first fragment of the UDP packet is the checksum for the entire UDP packet.

Checksum adder 214 writes this checksum to the checksum field of the header of the UDP packet, which is found in the payload of the first fragment (step 314). Then network interface 204 transmits the first fragment to network 104 (step 316).

Because the fragments are transmitted out of order, they will likely be received out of order. However, network protocols such as IP restore the order of received IP packets, and so restore the order of the fragments at the receiving network device 102.

While the embodiment described above is implemented in network interface controller 108, other embodiments are implemented within processor 106, as part of protocol stack 112 or device driver 118.

Figure 5:
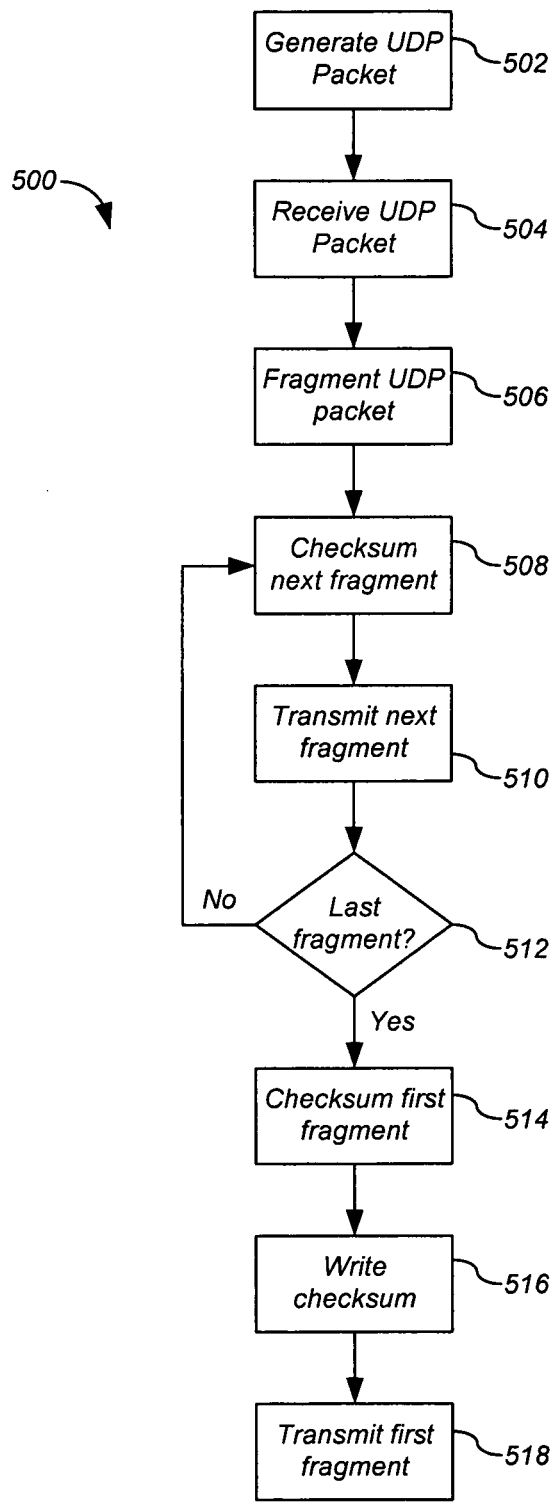
FIG. 5 depicts a checksum process performed by the protocol stack of FIG. 1 according to a preferred embodiment that implements UDP/IP.

FIG. 5 depicts a checksum process 500 performed by protocol stack 112 of FIG. 1 according to a preferred embodiment that implements UDP/IP. Other embodiments implement other transport-layer protocols, such as transport control protocol (TCP), and other network-layer protocols. UDP module 114 generates a UDP packet (step 502) having a size that exceeds the MTU of network 104. IP module 116 receives the UDP packet (step 504) and fragments the UDP packet (step 506), thereby producing two or more fragments. Each fragment is an IP packet, as described above with respect to FIG. 4.

IP module 116 calculates the checksum of the second fragment (step 508) and transmits the second fragment to device driver 118 (step 510), which sends the fragment to network interface controller 108, which sends the second fragment to network 104. In one embodiment, while one fragment is transmitted, the checksum is calculated for the next fragment, thereby reducing the latency of the process. In a preferred embodiment, the checksum for each fragment is calculated by forming a 16-bit one's complement of the one's complement sum of the payload of the IP packet, as described in "Computing the Internet Checksum," RFC 1071.

If the UDP packet has more than two fragments (step 512), the subsequent fragments are checksummed (step 508) and transmitted (step 510). The calculation of the checksum of each fragment continues from the checksum obtained from the previous fragment, if any, so that the checksum calculated for any fragment of a UDP packet includes the checksums previously calculated for other fragments of the UDP packet.

After the checksum has been calculated for the last fragment of the UDP packet, IP module 116 calculates the checksum of the first fragment of the UDP packet (step 514). The calculation of the checksum of the first fragment continues from the checksum obtained from the last fragment, so that the checksum calculated for the first fragment of the UDP packet is the checksum for the entire UDP packet.

IP module 116 writes this checksum to the checksum field of the header of the UDP packet, which is found in the payload of the first fragment (step 516). Then IP module 116 transmits the first fragment (step 518).

Figure 6:
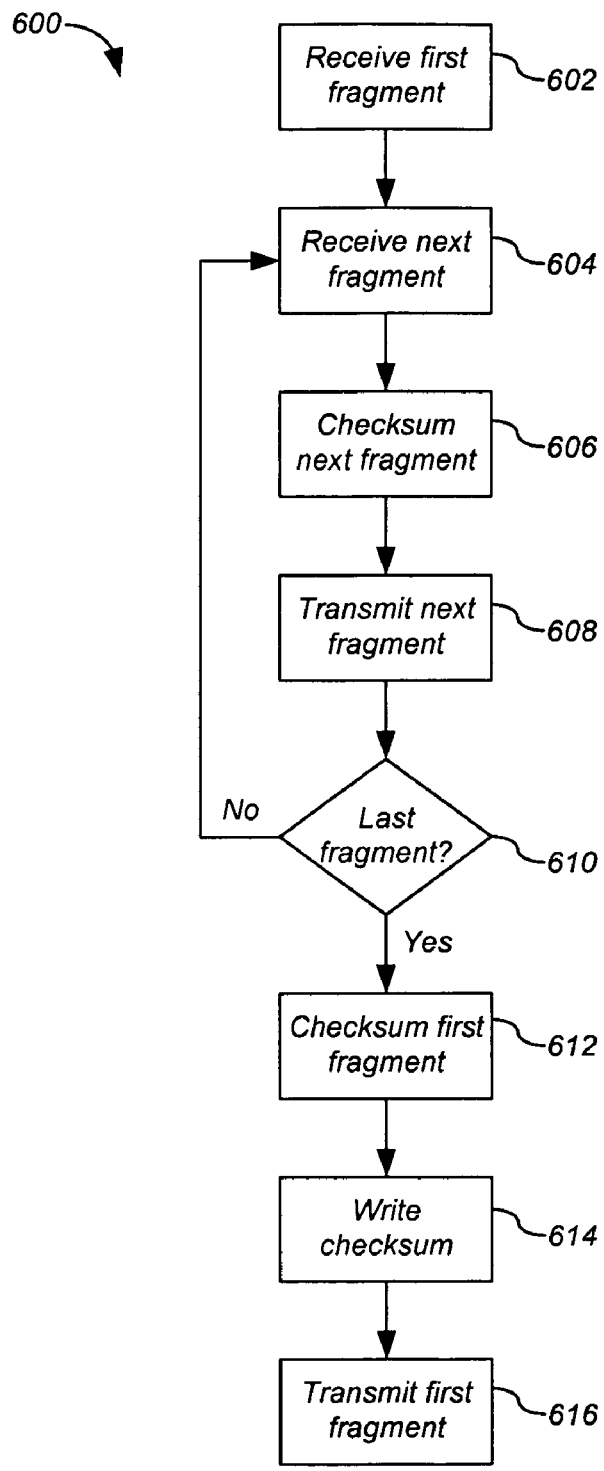
FIG. 6 depicts a checksum process performed by the device driver of FIG. 1 according to a preferred embodiment that implements UDP/IP.

FIG. 6 depicts a checksum process 600 performed by device driver 118 of FIG. 1 according to a preferred embodiment that implements UDP/IP. Other embodiments implement other transport-layer protocols, such as transport control protocol (TCP), and other network-layer protocols.

Device driver 118 receives the first fragment of a user datagram protocol (UDP) packet from IP module 116 (step 602). Each fragment of the UDP packet is an IP packet, as described above with respect to FIG. 4.

Device driver 118 receives the second fragment of the UDP packet (step 604) and calculates the checksum of the second fragment (step 606). Device driver 118 then transmits the second fragment to network interface controller 108, which transmits the second fragment to network 104 (step 608). In one embodiment, while one fragment is transmitted, the checksum is calculated for the next fragment, thereby reducing the latency of the process. In a preferred embodiment, the checksum for each fragment is calculated by forming a 16-bit one's complement of the one's complement sum of the payload of the IP packet, as described in "Computing the Internet Checksum," RFC 1071.

If the UDP packet has more fragments (step 610), the next fragment is received (step 604), checksummed (step 606), and transmitted to network 104 (step 608). The calculation of the checksum of each fragment continues from the checksum obtained from the previous fragment, if any, so that the checksum calculated for any fragment of a UDP packet includes the checksums calculated for the previous fragments of the UDP packet.

After the checksum has been calculated for the last fragment of the UDP packet, device driver 118 calculates the checksum of the first fragment of the UDP packet (step 612). The calculation of the checksum of the first fragment continues from the checksum obtained from the last fragment, so that the checksum calculated for the first fragment of the UDP packet is the checksum for the entire UDP packet.

Device driver 118 writes this checksum to the checksum field of the header of the UDP packet, which is found in the payload of the first fragment (step 614). Then device driver 118 transmits the first fragment to network 104 (step 616).

The invention can be implemented in digital electronic circuitry, or in computer hardware, firmware, software, or in combinations of them. Apparatus of the invention can be implemented in a computer program product tangibly embodied in a machine-readable storage device for execution by a programmable processor; and method steps of the invention can be performed by a programmable processor executing a program of instructions to perform functions of the invention by operating on input data and generating output. The invention can be implemented advantageously in one or more computer programs that are executable on a programmable system including at least one programmable processor coupled to receive data and instructions from, and to transmit data and instructions to, a data storage system, at least one input device, and at least one output device. Each computer program can be implemented in a high-level procedural or object-oriented programming language, or in assembly or machine language if desired; and in any case, the language can be a compiled or interpreted language. Suitable processors include, by way of example, both general and special purpose microprocessors. Generally, a processor will receive instructions and data from a read-only memory and/or a random access memory. Generally, a computer will include one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM disks. Any of the foregoing can be supplemented by, or incorporated in, ASICs (application-specific integrated circuits).

A number of implementations of the invention have been described. Nevertheless, it will be understood that various modifications may be made without departing from the spirit and scope of the invention. List any additional modifications or variations. Accordingly, other implementations are within the scope of the following claims.

What is claimed is:

1. A network interface controller, comprising:
   a first interface that sequentially receives second and first fragments of a packet comprising second and first data portions of the packet, respectively; and
   a checksum adder that calculates a first checksum for the first fragment based on a second checksum for the second fragment and the first data portion of the first fragment,
   wherein the network interface controller writes the first checksum to a checksum field in a header of the packet.

2. The network interface controller of claim 1, further comprising a second interface that transmits the first fragment after transmitting the second fragment.

3. The network interface controller of claim 2, wherein the second interface transmits a second packet comprising the second fragment.

4. The network interface controller of claim 3, wherein the second interface transmits a third packet comprising the first fragment.

5. The network interface controller of claim 4, wherein the packet is a transport-layer packet and wherein the second and third packets are network-layer packets.

6. The network interface controller of claim 5, wherein the transport-layer packet is a user datagram protocol (UDP) packet.

7. The network interface controller of claim 5, wherein the transport-layer packet is a transport control protocol (TCP) packet.

8. The network interface controller of claim 5, wherein the network-layer packets are Internet protocol (IP) packets.

9. The network interface controller of claim 1, wherein the checksum adder calculates the first checksum by starting with the second checksum.

10. The network interface controller of claim 1, wherein the checksum adder generates the first and second checksums using a one's complement.

11. A network interface controller, comprising:
    a first interface that receives N fragments comprising N data portions of a packet, respectively; and
    a checksum adder that calculates a first checksum for one of a second to $N^{th}$ one of the N fragments, and that calculates additional checksums for others of the second to Nth ones of the N fragments,
    wherein calculations for each of the additional checksums begins with a preceding checksum,
    wherein the checksum adder generates an $N^{th}$ checksum for a first fragment based on a last checksum for the second to Nth ones of the N fragments and a first data portion of the first fragment, and
    wherein the network interface controller writes the $N^{th}$ checksum to a checksum field in a header of the packet.

12. The network interface controller of claim 11 wherein the N fragments are received in an out of order sequence.

13. The network interface controller of claim 11, further comprising a second interface that transmits the first fragment after transmitting the second to $N^{th}$ fragments.

14. The network interface controller of claim 13, wherein the second interface transmits N−1 packets comprising the second to $N^{th}$ fragments.

15. The network interface controller of claim 14, wherein the second interface transmits another packet comprising the first fragment.

16. The network interface controller of claim 15, wherein the packet is a transport-layer packet.

17. The network interface controller of claim 16, wherein the second to $N^{th}$ packets and the another packet are network-layer packets.

18. The network interface controller of claim 17, wherein the transport-layer packet is a user datagram protocol (UDP) packet.

19. The network interface controller of claim 17, wherein the transport-layer packet is a transport control protocol (TCP) packet.

20. The network interface controller of claim 17, wherein the network-layer packets are Internet protocol (IP) packets.

21. A method for operating an network interface controller, comprising:
    sequentially receiving second and first fragments of a packet comprising second and first data portions of the packet, respectively;
    calculating a first checksum for the first fragment based on a second checksum for the second fragment and the first data portion of the first fragment; and
    writing the first checksum to a checksum field in a header of the packet.

22. The method of claim 21, further comprising transmitting the first fragment after transmitting the second fragment.

23. The method of claim 22, further comprising transmitting a second packet comprising the second fragment.

24. The method of claim 23, further comprising transmitting a third packet comprising the first fragment.

25. The method of claim 24, wherein the packet is a transport-layer packet and wherein the second and third packets are network-layer packets.

26. The method of claim 25, wherein the transport-layer packet is a user datagram protocol (UDP) packet.

27. The method of claim 25, wherein the transport-layer packet is a transport control protocol (TCP) packet.

28. The method of claim 25, wherein the network-layer packets are Internet protocol (IP) packets.

29. The method of claim 21, further comprising calculating the first checksum by starting with the second checksum.

30. The method of claim 21, further comprising generating the first and second checksums using a one's complement.

31. A method for operating an network interface controller, comprising:
   receiving N fragments comprising N data portions of a packet, respectively;
   calculating a first checksum for one of a second to $N^{th}$ one of the N fragments;
   calculating additional checksums for others of the second to Nth ones of the N fragments, wherein calculations for each of the additional checksums begins with a preceding checksum;
   generating an $N^{th}$ checksum for a first fragment based on a last checksum for the second to Nth ones of the N fragments and a first data portion of the first fragment; and
   writing the $N^{th}$ checksum to a checksum field in a header of the packet.

32. The method of claim 31 further comprising receiving the N fragments in an out of order sequence.

33. The method of claim 31, further comprising transmitting the first fragment after transmitting the second to $N^{th}$ fragments.

34. The method of claim 33, further comprising transmitting N−1 packets comprising the second to $N^{th}$ fragments.

35. The method of claim 34, further comprising transmitting another packet comprising the first fragment.

36. The method of claim 34, wherein the packet is a transport-layer packet.

37. The method of claim 36, wherein the second to $N^{th}$ packets and the another packet are network-layer packets.

38. The method of claim 37, wherein the transport-layer packet is a user datagram protocol (UDP) packet.

39. The method of claim 37, wherein the transport-layer packet is a transport control protocol (TCP) packet.

40. The method of claim 37, wherein the network-layer packets are Internet protocol (IP) packets.

* * * * *